(12) United States Patent
Hirosawa

(10) Patent No.: US 12,315,716 B2
(45) Date of Patent: May 27, 2025

(54) WAFER PROCESSING METHOD

(71) Applicant: DISCO CORPORATION, Tokyo (JP)

(72) Inventor: Shunichiro Hirosawa, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 482 days.

(21) Appl. No.: 17/804,159

(22) Filed: May 26, 2022

(65) Prior Publication Data

US 2022/0392762 A1    Dec. 8, 2022

(30) Foreign Application Priority Data

Jun. 2, 2021  (JP) ................. 2021-093010

(51) Int. Cl.
  *H01L 21/02* (2006.01)
  *H01L 21/268* (2006.01)
  *H01L 21/304* (2006.01)
  *H01L 21/683* (2006.01)

(52) U.S. Cl.
  CPC ...... *H01L 21/02035* (2013.01); *H01L 21/268* (2013.01); *H01L 21/304* (2013.01); *H01L 21/6836* (2013.01); *H01L 2221/68327* (2013.01)

(58) Field of Classification Search
  CPC ............. H01L 21/02035; H01L 21/268; H01L 21/304; H01L 21/6836
  See application file for complete search history.

(56) References Cited

U.S. PATENT DOCUMENTS

2006/0079155 A1\* 4/2006 Nakamura ............ H01L 21/302
                                                                451/41
2008/0242052 A1   10/2008 Feng et al.
2010/0048000 A1    2/2010 Kobayashi et al.
2018/0005862 A1\*  1/2018 Priewasser ............ H01L 21/304
2019/0385888 A1\* 12/2019 Hattori .............. H01L 21/67259
(Continued)

FOREIGN PATENT DOCUMENTS

EP     3979300 A1    4/2022
JP  2000173961 A     6/2000
(Continued)

OTHER PUBLICATIONS

Office Action issued in counterpart German patent application No. 10 2022 205 175.0, dated Mar. 27, 2024.
(Continued)

*Primary Examiner* — Joseph C. Nicely
(74) *Attorney, Agent, or Firm* — Greer, Burns & Crain, Ltd

(57) ABSTRACT

A wafer processing method includes the steps of forming a bonded wafer by bonding one surface of a first wafer which is chambered at an outer peripheral edge and includes a device region and an outer peripheral surplus region, to a second wafer, irradiating a laser beam along the outer peripheral edge of the first wafer and forming an annular modified region, thereby segmenting the first wafer into an outer peripheral annular portion and a central region, bonding an expand tape to the other surface of the first wafer, expanding the expand tape, thereby splitting the first wafer into the outer peripheral annular portion and the central region from the annular modified region as a starting point and breaking off the outer peripheral annular portion from the bonded wafer, and grinding the first wafer from the other surface to a finish thickness.

4 Claims, 8 Drawing Sheets

(56) References Cited

U.S. PATENT DOCUMENTS

| | | | |
|---|---|---|---|
| 2020/0343095 A1 | 10/2020 | Harada et al. | |
| 2021/0242010 A1* | 8/2021 | Tanoue | H01L 21/68764 |
| 2021/0257256 A1* | 8/2021 | Nakamura | H01L 21/268 |
| 2021/0296119 A1* | 9/2021 | Tanoue et al. | H01L 21/187 |
| 2021/0327772 A1* | 10/2021 | Tanoue | H01L 21/681 |
| 2022/0254638 A1* | 8/2022 | Tanoue | B23K 26/0823 |
| 2024/0082957 A1* | 3/2024 | Tanoue | B23K 26/0823 |
| 2024/0312804 A1* | 9/2024 | Tanoue | H01L 21/02 |

FOREIGN PATENT DOCUMENTS

| | | | |
|---|---|---|---|
| JP | 2002334853 A | | 11/2002 |
| JP | 2006108532 A | | 4/2006 |
| JP | 2007027250 A | | 2/2007 |
| JP | 3222318 U | * | 7/2019 |
| JP | 2020025112 A | * | 2/2020 |
| JP | 2020181890 A | | 11/2020 |
| WO | 2020054504 A1 | | 3/2020 |

OTHER PUBLICATIONS

Japanese Patent Application 2021-093010 : English translation of Office Action, Feb. 25, 2025 (4 pages).

* cited by examiner

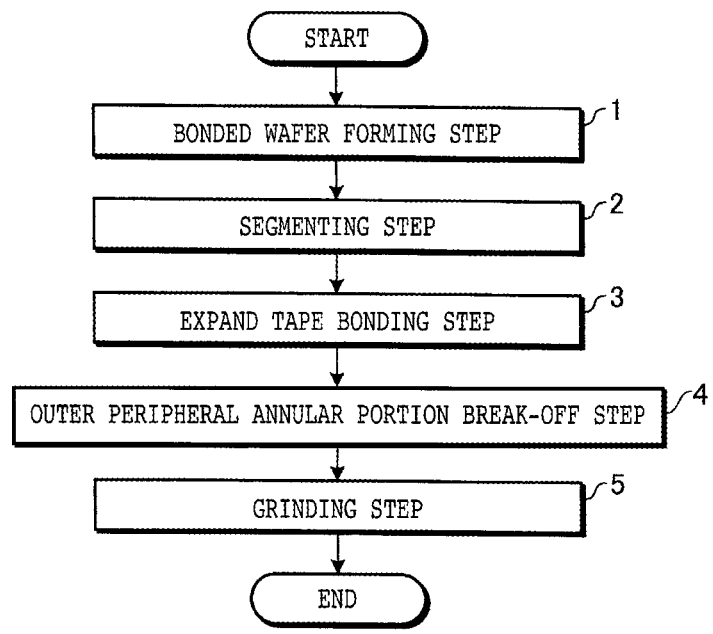
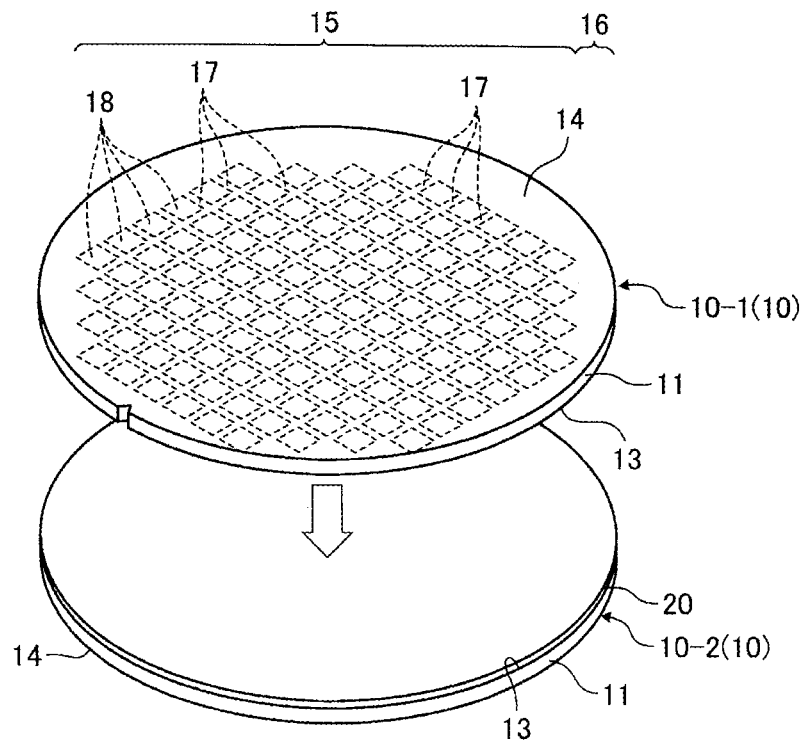

WAFER PROCESSING METHOD

BACKGROUND OF THE INVENTION

Field of the Invention

The present invention relates to a wafer processing method.

Description of the Related Art

In semiconductor device fabrication processes, processing is performed to bond two wafers together in processes for three-dimensional stacked chips such as through-silicon vias (TSVs), processes for backside illuminated (BSI) scientific complementary metal oxide semiconductor (CMOS) image sensors, in which two wafers with integrated pixel circuits formed therein are bonded, and the like.

Such a bonded wafer is generally thinned by grinding to fulfil the demand for low-profile device chips. However, its outer peripheral edge has been chamfered and formed in a round shape. The grinding therefore forms an acute angle at the outer peripheral edge (a generally-called knife edge) and is prone to cause edge chipping. Because spreading of this edge chipping may lead to damage on devices, a technique has been proposed to apply processing (edge trimming) to remove the part of the outer peripheral edge before grinding the wafer (see JP 2000-173961A). Another technique has also been proposed to prevent edge chipping which occurs during grinding, from spreading to devices by beforehand irradiating a laser beam along an outer peripheral edge of a device region, so that a modified layer is formed (see JP 2006-108532A).

SUMMARY OF THE INVENTION

However, the technique described in JP 2000-173961A has a problem that devices are smeared with debris occurred during cutting and the smear cannot be fully removed even by rinsing. On the other hand, the technique described in JP 2006-108532A involves a different problem that the part of an outer peripheral surplus region is broken off in a ring shape or arcuate shape, thereby scratching or otherwise damaging grinding stones to deleteriously affects the processing results or requiring frequent cleaning of broken-off fragments piled up in a grinding apparatus.

The present invention therefore has as an object thereof the provision of a wafer processing method which can reduce such a deleterious effect as arising upon break-off of the part of an outer peripheral surplus region that surrounds a device region in a bonded wafer.

In accordance with an aspect of the present invention, there is provided a wafer processing method. The wafer processing method includes a bonded wafer forming step of forming a bonded wafer by bonding one of surfaces of a first wafer that includes on the one surface thereof a device region with devices formed therein and an outer peripheral surplus region surrounding the device region and is chamfered at an outer peripheral edge thereof, to one of surfaces of a second wafer, a segmenting step of irradiating a laser beam of a wavelength that has transmissivity for the first wafer along a position on a side inner by a predetermined distance from the outer peripheral edge of the first wafer and forming an annular modified region, thereby segmenting the first wafer into an outer peripheral annular portion corresponding to the outer peripheral surplus region and a central region corresponding to the device region, an expand tape bonding step of, before or after performing the segmenting step, bonding an expand tape which has expandability, to the other surface of the first wafer, an outer peripheral annular portion break-off step of, after performing the bonded wafer forming step, the segmenting step, and the expand tape bonding step, expanding the expand tape, thereby splitting the first wafer into the outer peripheral annular portion and the central region from the annular modified region as a starting point and breaking off the outer peripheral annular portion from the bonded wafer, and a grinding step of, after performing the outer peripheral annular portion break-off step, grinding the first wafer of the bonded wafer from a side of the other surface thereof to a finish thickness.

Preferably, the segmenting step may include, after segmenting the first wafer into the outer peripheral annular portion and the central region, a supplemental segmenting step of irradiating the laser beam to the outer peripheral annular portion and forming modified regions in a like plurality of radial directions, thereby segmenting the outer peripheral annular portion into a plurality of arcuate portions.

Preferably, the outer peripheral annular portion break-off step may include a cooled expansion step of causing the expand tape to expand while cooling the same.

Preferably, the outer peripheral annular portion break-off step may further include, after performing the cooled expansion step, a heat shrinking step of heating a slack part of the expand tape, the slack part having been formed through expansion of the expand tape to shrink the slack part.

The present invention can reduce such a deleterious effect as arising from break-off of the part of an outer peripheral surplus region that surrounds a device region in a bonded wafer.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 1 is a flow chart depicting a flow of a wafer processing method according to an embodiment of the present invention.

FIG. 2 is a perspective view depicting a state in a bonded wafer forming step depicted in FIG. 1.

DETAILED DESCRIPTION OF THE PREFERRED EMBODIMENT

With reference to the attached drawings, a description will be made in detail about an embodiment of the present invention. However, the present invention shall not be limited by details that will be described in the subsequent embodiment. The elements of configurations that will hereinafter be described include those readily conceivable to persons skilled in the art and substantially the same ones. Further, the configurations that will hereinafter be described can be combined appropriately. Furthermore, various omissions, replacements and modifications of configurations can be made without departing from the spirit of the present invention.

A processing method according to the embodiment of the present invention for a wafer 10 (see FIG. 2, etc.) will be described based on the drawings. In the processing method of this embodiment for the wafer 10, paired wafers 10 are bonded to each other on sides of one surface thereof, and one of the wafers 10 (hereinafter called "a first wafer 10-1") is thinned to a predetermined finish thickness.

It is to be noted that, when distinguishing the individual wafers 10 in the paired wafers 10 in the subsequent description, one of the wafers 10 is referred to as the first wafer 10-1 as described above, and the other wafer 10 will be referred to as a second wafer 10-2, and otherwise, the paired wafers 10 will be referred to simply as the wafer 10. The first wafer 10-1 to be thinned is, for example, a TSV wafer. In this embodiment, the second wafer 10-2 which is not to be thinned will be described as a TSV wafer similar to the first wafer 10-1, although the second wafer 10-2 may be a simple substrate wafer without any pattern in the present invention.

FIG. 1 is a flow chart depicting a flow of the processing method according to this embodiment for the wafer 10. As depicted in FIG. 1, the processing method of this embodiment for the wafer 10 includes a bonded wafer forming step 1, a segmenting step 2, an expand tape bonding step 3, an outer peripheral annular portion break-off step 4, and a grinding step 5.

(Bonded Wafer Forming Step 1)

Figure 3:
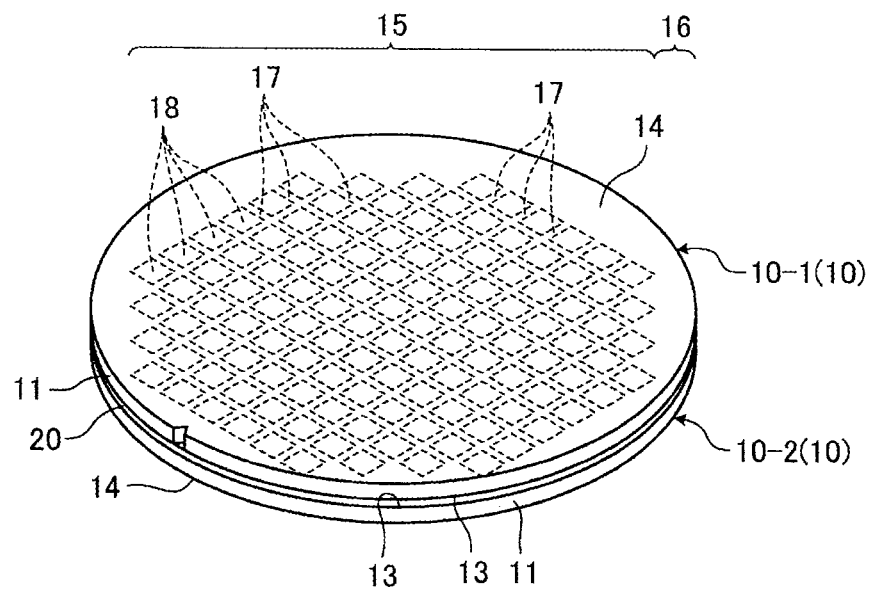
FIG. 3 is a perspective view depicting a state after the state of FIG. 2 in the bonded wafer forming step depicted in FIG. 1.

FIG. 2 is a perspective view depicting a state in the bonded wafer forming step 1 depicted in FIG. 1. FIG. 3 is a perspective view depicting a state after the state of FIG. 2 in the bonded wafer forming step depicted in FIG. 1. In the bonded wafer forming step 1, the one surface of the first wafer 10-1 is bonded to the one surface of the second wafer 10-2 to form a bonded wafer.

A description will first be made about a configuration of the wafer 10 (the first wafer 10-1 and the second wafer 10-2) to be processed. The wafer 10 is a disc-shaped semiconductor wafer, optical device wafer, or the like, in which silicon (Si), sapphire ($Al_2O_3$), gallium arsenide (GaAs), silicon carbide (SiC), or the like is used as a substrate 11. The wafer 10 is chamfered at an outer peripheral edge 12 (see FIG. 4) thereof. In this embodiment, the outer peripheral edge 12 is formed in an arcuate form extending from a front surface 13 to a back surface 14 of the substrate 11 as seen in cross-section so that a center of the outer peripheral edge 12 in a thickness direction protrudes most toward an outer periphery. In this embodiment, the first wafer 10-1 and the second wafer 10-2 are, each, 300 mm in diameter and 700 μm in thickness.

The wafer 10 includes, on a side of the front surface 13 of the substrate 11, a device region 15, and an outer peripheral surplus region 16 surrounding the device region 15. The device region 15 has, at the front surface 13 of the substrate 11, a plurality of scribe lines (hereinafter called "streets") 17 set in a grid pattern, and devices 18 formed in respective regions defined by the streets 17. The outer peripheral surplus region 16 surrounds the device region 15 over an entire periphery thereof and is a region where no device 18 is formed.

In this embodiment, the devices 18 constitute 3DNAND flash memories, respectively, and each include electrode pads and vias connected to the corresponding electrode pads. The vias extend through the substrate 11 to a side of the back surface 14 when the substrate 11 is thinned and the devices 18 are individually divided from the wafer 10. In other words, the wafer 10 of this embodiment is a generally-called TSV wafer from which the devices 18 are individually divided with the vias. It is to be noted that the wafer 10 according to the present invention is not limited to the TSV wafer with the vias in the embodiment and may be a device wafer without the vias.

In the bonded wafer forming step 1, the one surface of the first wafer 10-1, the one surface including the device region 15 and the outer peripheral surplus region 16, is bonded to the one surface of the second wafer 10-2. Described specifically, in the bonded wafer forming step 1 in this embodiment, the front surface 13 of the first wafer 10-1 is bonded to the front surface 13 of the second wafer 10-2.

In the bonded wafer forming step 1, a bonding layer 20 is stacked on one of the front surface 13 of the first wafer 10-1 or the front surface 13 of the second wafer 10-2. In this embodiment, the bonding layer 20 is stacked on the front surface 13 of the second wafer 10-2. It is to be noted that in this embodiment, the bonding layer 20 is a double-sided tape with bonding material layers stacked on front and back sides of a base material layer, respectively, but in the present invention, is not limited to such a double-sided tape and may be, for example, an oxide film, or one formed by applying an adhesive, which contains a resin or the like, to front and back sides of a base material layer, respectively.

In the bonded wafer forming step 1, the front surface 13 of the first wafer 10-1 and the front surface 13 of the second wafer 10-2 are first brought into a face-to-face relation with a spacing therebetween as depicted in FIG. 2. As depicted in FIG. 3, the front surface 13 of the first wafer 10-1 and the front surface 13 of the second wafer 10-2 are then bonded together via the bonding layer 20. As a consequence, the bonded wafer is formed.

(Segmenting Step 2)

Figure 4:
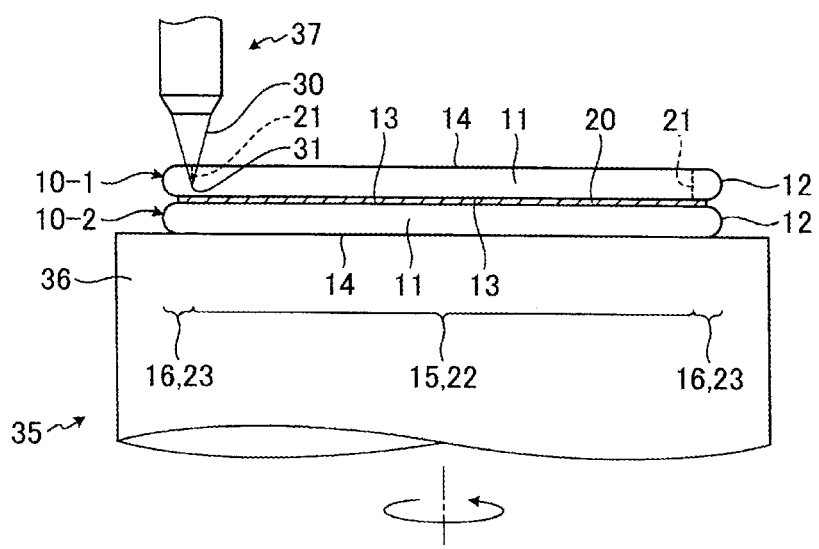
FIG. 4 is a cross-sectional view schematically depicting a state in a segmenting step depicted in FIG. 1.
Figure 5:
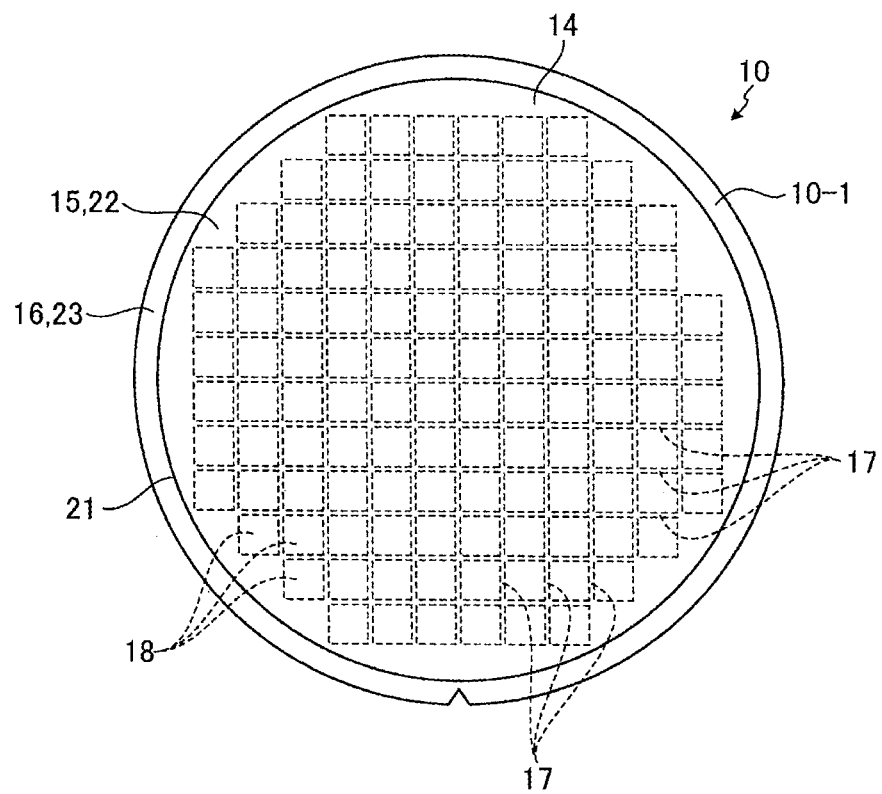
FIG. 5 is a plan view schematically depicting a wafer after the segmenting step depicted in FIG. 1.

FIG. 4 is a cross-sectional view schematically depicting a state in a segmenting step 2 depicted in FIG. 1. FIG. 5 is a plan view schematically depicting the wafer 10 after the segmenting step 2 depicted in FIG. 1. In the segmenting step 2, the first wafer 10-1 is segmented into a central region 22 which corresponds to the device region 15, and an outer peripheral annular portion 23 which corresponds to the outer peripheral surplus region 16.

In the segmenting step 2, a laser beam 30 is irradiated to the first wafer 10-1 at a position on a side inner by a predetermined distance from the outer peripheral edge 12, whereby a modified region 21 is formed as a starting point of segmentation. The position on the side inner by the predetermined distance from the outer peripheral edge 12 of the first wafer 10-1 indicates a position where the central region 22 and the outer peripheral annular portion 23 of the first wafer 10-1 are segmented from each other, in other words, an outer peripheral edge of the device region 15. The laser beam 30 is of a wavelength having transmissivity for the first wafer 10-1, for example, infrared rays (IR).

The modified region 21 means a region which is different in density, refractive index, mechanism strength, and/or other physical characteristics from a surrounding region. The modified region 21 is, for example, a fusion treatment region, a cracked region, a dielectric breakdown region, a refractive index change region, and/or a region where two or more of such regions exist in combination. The modified region 21 is lower in mechanical strength or the like than the remaining portions of the first wafer 10-1.

In the segmenting step 2, the modified region 21 is formed in the first wafer 10-1 through stylus dicing by a laser processing apparatus 35. The laser processing apparatus 35 includes a chuck table 36, a laser beam irradiation unit 37 that irradiates the laser beam 30 toward the wafer 10 held on a holding surface of the chuck table 36, and a moving unit that relatively moves the chuck table 36 and the laser beam irradiation unit 37.

In the segmenting step 2, the second wafer 10-2 is first held on the side of the back surface 14 thereof under suction on the holding surface of the chuck table 36, and the chuck table 36 is then moved to a processing position by the moving unit. After the laser beam irradiation unit 37 is next placed opposite in a vertical direction to the outer peripheral edge of the device region 15 from the side of the back surface 14 of the first wafer 10-1, a focal point 31 of the laser beam 30 is set inside the first wafer 10-1.

In the segmenting step 2, the laser beam 30 is then irradiated from the laser beam irradiation unit 37 to the first wafer 10-1 while rotating the chuck table 36 about an axis of rotation that is parallel to the vertical direction. Described specifically, the laser beam 30 is irradiated along the outer peripheral edge of the device region 15 of the first wafer 10-1, so that the modified region 21 is continuously formed in an annular form along the outer peripheral edge.

Here in the segmenting step 2, the laser beam 30 is irradiated a plurality of times with its focal point 31 being changed each time. As an alternative, a laser beam which has a plurality of focal points apart from one another in the thickness direction of the first wafer 10-1 is irradiated, whereby a plurality of modified regions 21 is formed in the thickness direction of the first wafer 10-1. Cracks spread from the modified region or regions 21, and as a result of connection of the modified region or regions 21 and the cracks, the first wafer 10-1 is segmented into the central region 22 which corresponds to the device region 15, and the outer peripheral annular portion 23 which corresponds to the outer peripheral surplus region 16.

It is to be noted that for the processing by the laser processing apparatus 35 in the segmenting step 2 in this embodiment, conditions for the laser beam 30 may be set as follows: (1) wavelength: IR range, (2) frequency: 90 kHz, (3) number of laser scans (in the thickness direction): 6 scans, and (4) average power output: 6 W.

(Supplemental Segmenting Step)

Figure 6:
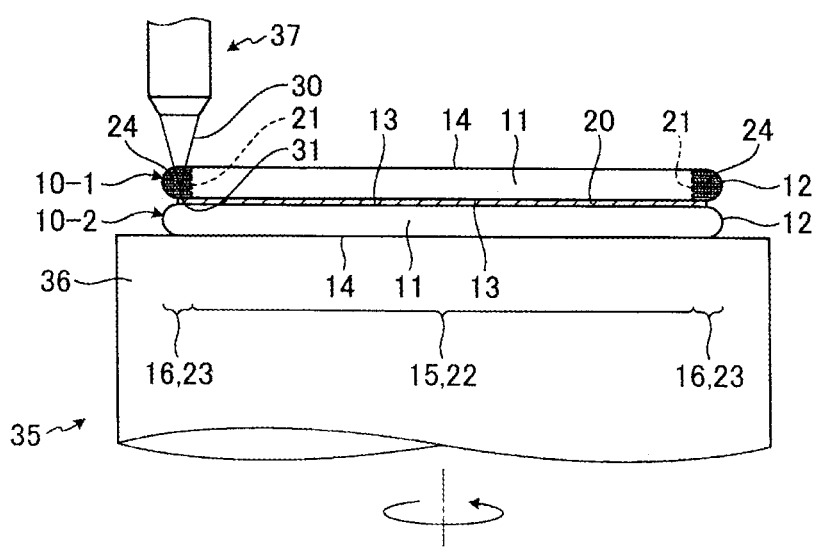
FIG. 6 is a cross-sectional view schematically depicting a state in a supplemental segmenting step in the segmenting step depicted in FIG. 1.
Figure 7:
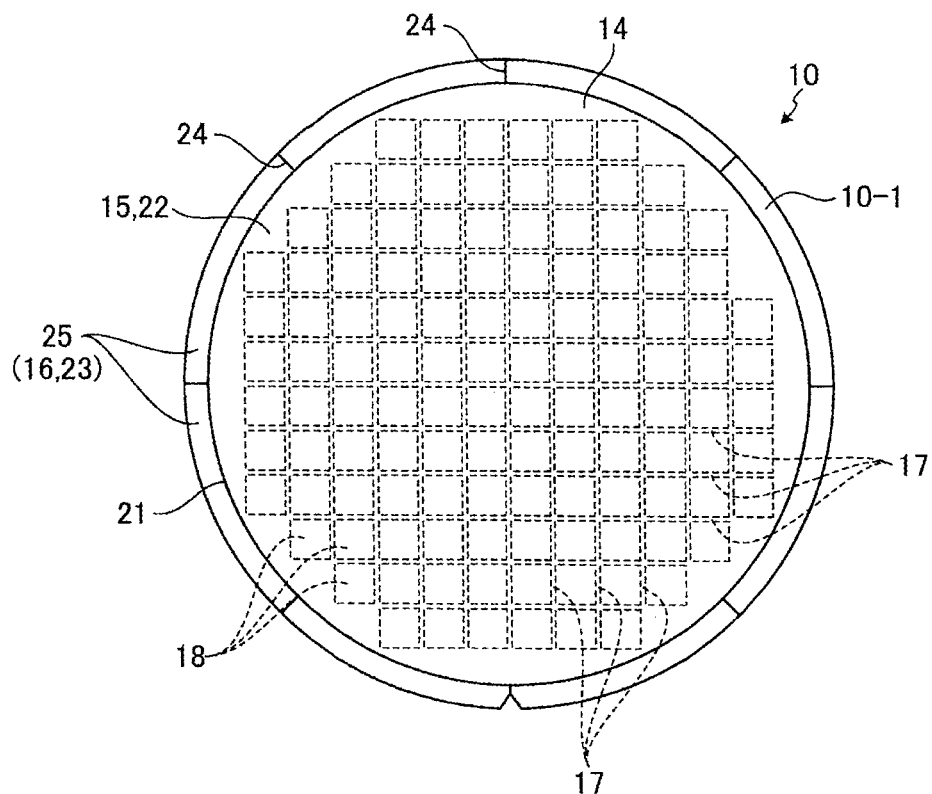
FIG. 7 is a plan view schematically depicting the wafer after the supplemental segmenting step depicted in FIG. 6.

In the segmenting step 2 in this embodiment, a supplemental segmenting step is further performed as will be described hereinafter. FIG. 6 is a cross-sectional view schematically depicting a state in the supplemental segmenting step in the segmenting step 2 depicted in FIG. 1. FIG. 7 is a plan view schematically depicting the wafer 10 after the supplemental segmenting step. In the supplemental segmenting step, after segmenting the first wafer 10-1 into the central region 22 and the outer peripheral annular portion 23, the outer peripheral annular portion 23 is segmented into a plurality of arcuate portions 25.

In the supplemental segmenting step, the laser beam 30 is irradiated to the first wafer 10-1 at a predetermined position in a peripheral direction in the outer peripheral annular portion 23 between an inner peripheral edge and an outer peripheral edge of the outer peripheral annular portion 23, whereby a modified region 24 is formed in a radial direction as a supplemental starting point of segmentation.

In the supplemental segmenting step, the laser beam irradiation unit 37 is first placed opposite in the vertical direction to a predetermined position on the outer peripheral edge of the device region 15 from the side of the back surface 14 of the first wafer 10-1, and the focal point 31 of the laser beam 30 is then set inside the first wafer 10-1.

In the supplemental segmenting step, the laser beam 30 is next irradiated from the laser beam irradiation unit 37 to the first wafer 10-1 while relatively moving the chuck table 36 and the laser beam irradiation unit 37 by the moving unit. Here, the chuck table 36 is moved so that the focal point 31 of the laser beam 30 moves outward in the radial direction of the first wafer 10-1. Described specifically, the modified region 24 is formed continuously in the radial direction by irradiating the laser beam 30 in the radial direction to the outer peripheral annular portion 23 that corresponds to the outer peripheral surplus region 16.

Here in the supplemental segmenting step, the laser beam 30 is irradiated a plurality of times with its focal point 31 being changed each time. As an alternative, the laser beam which has the plurality of focal points apart from one another in the thickness direction of the first wafer 10-1 is irradiated, whereby a plurality of modified regions 24 is formed in the thickness direction of the first wafer 10-1. Cracks spread from the modified region or regions 24, and as a result of connection of the modified region or regions 24 and the cracks, the outer peripheral annular portion 23 of the first wafer 10-1, the outer peripheral annular portion 23 corresponding to the outer peripheral surplus region 16, is segmented into the plurality of arcuate portions 25.

It is to be noted that in the supplemental segmenting step in this embodiment depicted in FIG. 7, the outer peripheral annular portion 23 is segmented into 8 arcuate portions 25, but in the present invention, may be further segmented, for example, twice into 16 arcuate portions 25, and also that the number of segmentations may be appropriately set according to the dimensions of the diameter of the first wafer 10-1 and the width of the outer peripheral annular portion 23. In this embodiment, the laser beam 30 is irradiated while moving the chuck table 36 so that the focal point 31 is moved from an inner side toward an outer side in the radial direction of the first wafer 10-1. In this invention, however, the laser beam 30 may also be irradiated while moving the chuck table 36 so that the focal point 31 is moved from the outer side toward the inner side in the radial direction of the first wafer 10-1. If this is the case, the irradiation of the laser beam 30 is stopped when the focal point 31 has reached the annular modified region 21. In this embodiment, processing conditions for the processing by the laser processing apparatus 35 in the supplemental segmenting step may be set to be the same as those at the time of the formation of the modified region 21.

(Expand Tape Bonding Step 3)

Figure 8:
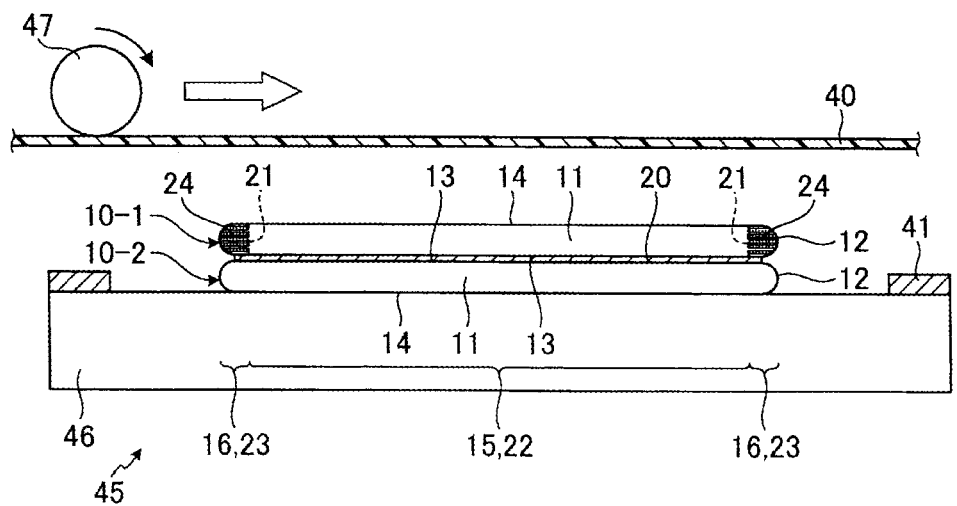
FIG. 8 is a cross-sectional view schematically depicting a state in an expand tape bonding step depicted in FIG. 1.

FIG. 8 is a cross-sectional view schematically depicting a state in an expand tape bonding step 3 depicted in FIG. 1. In the expand tape bonding step 3, an expand tape 40 having expandability is bonded to the other surface of the first wafer 10-1, the other surface being on a side opposite to the one surface on which the second wafer 10-2 is bonded.

Described specifically, the expand tape 40 is bonded to the back surface 14 of the first wafer 10-1 in the expand tape bonding step 3 in this embodiment. The expand tape bonding step 3 is performed before or after performing the segmenting step 2. If the expand tape bonding step 3 is performed before performing the segmenting step 2, the laser beam 30 is irradiated to the first wafer 10-1 through the expand tape 40.

The expand tape 40 has, for example, a base material layer made from a synthetic resin, and an adhesive layer stacked on the base material layer. In the expand tape bonding step 3, the expand tape 40 is bonded to the back surface 14 of the first wafer 10-1, for example, by a mounter 45. The mounter 45 includes a holding table 46, and a roller 47 that rolls in a direction parallel to a holding surface of the holding table 46.

In the expand tape bonding step 3, one of surfaces of an annular frame 41, which has an inner diameter greater than an outer diameter of the second wafer 10-2, and the back surface 14 of the second wafer 10-2 are first held on the holding surface of the holding table 46. Here, the mounter 45 holds the second wafer 10-2 and the frame 41 at positions where the second wafer 10-2 remains coaxial with the frame 41 inside an opening of the frame 41.

Next, in the expand tape bonding step 3, the expand tape 40 is bonded to the other surface of the frame 41 and the back surface 14 of the first wafer 10-1, and by the roller 47 moving along the back surface 14 of the first wafer 10-1, the expand tape 40 is pressed against the other surface of the frame 41 and the back surface 14 of the first wafer 10-1 so that the expand tape 40 is bonded in close contact with the other surface of the frame 41 and the back surface 14 of the first wafer 10-1.

(Outer Peripheral Annular Portion Break-Off Step 4)

Figure 9:
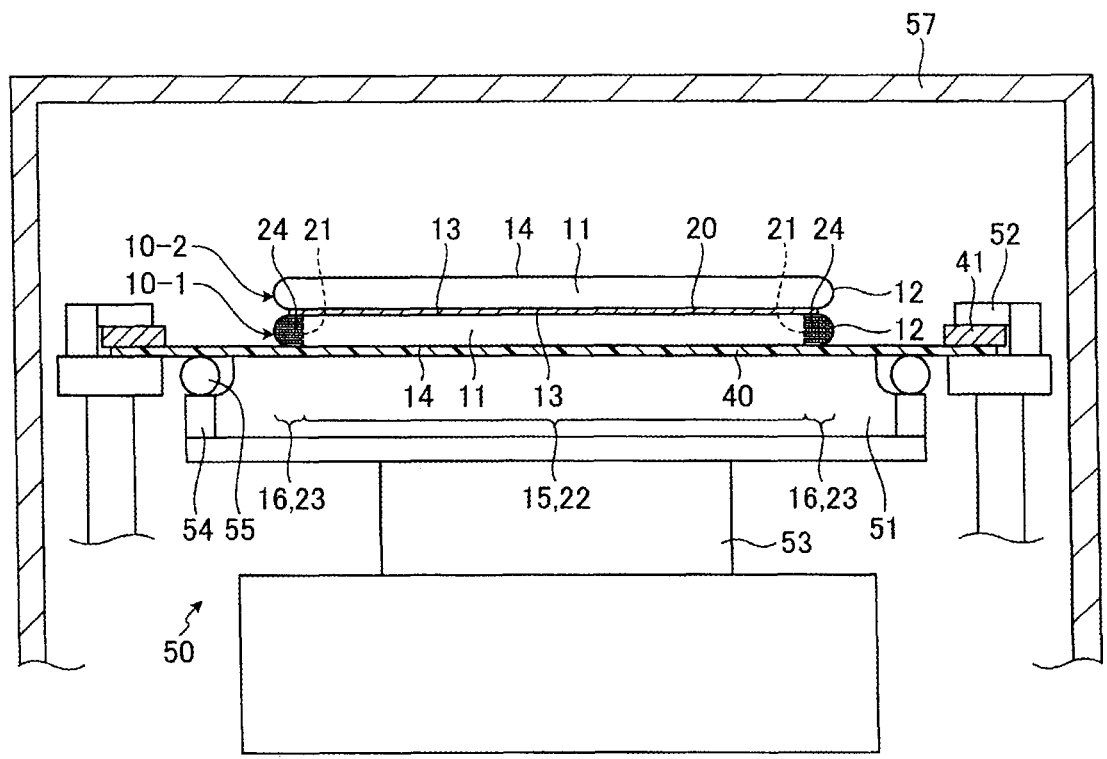
FIG. 9 is a cross-sectional view schematically depicting a state in an outer peripheral annular portion break-off step depicted in FIG. 1.

FIG. 9 is a cross-sectional view schematically depicting a state in an outer peripheral annular portion break-off step 4 depicted in FIG. 1. In the outer peripheral annular portion break-off step 4, the first wafer 10-1 is split into the outer peripheral annular portion 23 and the central region 22 while using the annular modified region 21 as a starting point, so that the outer peripheral annular portion 23 is broken off from the boned wafer.

The outer peripheral annular portion break-off step 4 is performed after performing the bonded wafer forming step 1, the segmenting step 2, and the expand tape bonding step 3. In the outer peripheral annular portion break-off step 4, an expansion device 50 applies an external force in a radial direction to the expand tape 40 to cause the expand tape 40 to expand in a plane direction, whereby the first wafer 10-1 is split into the outer peripheral annular portion 23 and the central region 22. The expansion device 50 includes a chuck table 51, clamp members 52, a lift unit 53, push-up members 54, roller members 55, and a heating unit 56 (see FIG. 11). The expansion device 50 is disposed within a chamber 57. The chamber 57 can be sealed and can be cooled internally.

In the outer peripheral annular portion break-off step 4, the side of the back surface 14 of the first wafer 10-1 is first placed on the holding surface of the chuck table 51 via the expand tape 40, and the frame 41 is then fixed at an outer peripheral portion thereof by the clamp members 52. Here, the roller members 55 come into contact with the expand tape 40 between an inner peripheral edge of the frame 41 and the outer peripheral edge 12 of the first wafer 10-1. In the outer peripheral annular portion break-off step 4, a cooled expansion step and a heat shrinking step are performed sequentially.

(Cooled Expansion Step)

Figure 10:
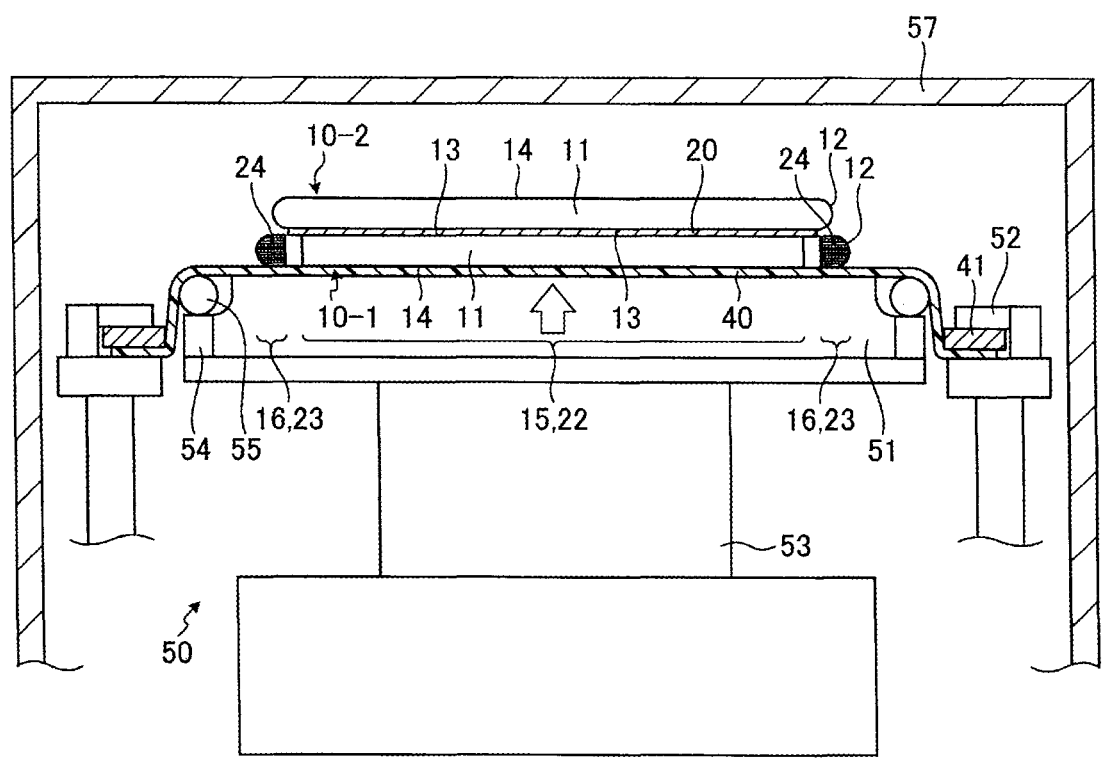
FIG. 10 is a cross-sectional view schematically depicting a state in a cooled expansion step in the outer peripheral annular portion break-off step depicted in FIG. 1.

FIG. 10 is a cross-sectional view schematically depicting a state in the cooled expansion step in the outer peripheral annular portion break-off step 4 depicted in FIG. 1. In the cooled expansion step, the expand tape 40 is caused to expand while being cooled.

In the cooled expansion step, the expand tape 40 is cooled and hardened. In the cooled expansion step in this embodiment, the chamber 57 with the expansion device 50 accommodated therein is normally cooled internally in its entirety. Along with the bonded wafer (the first wafer 10-1 and the second wafer 10-2) held on the frame 41 via the expand tape 40, the expand tape 40 is loaded into the cooled chamber 57 and is sufficiently cooled before beginning its expansion. The cooling temperature in the chamber 57 is, for example, approximately 0° C. It is to be noted that in the cooled expansion step in this invention, the expand tape 40 may also be cooled by cooling the chuck table 51.

In the cooled expansion step, the chuck table 51 and the push-up members 54 are integrally raised by the lift unit 53 while cooling the expand tape 40 in the cooled chamber 57. As the expand tape 40 is fixed at an outer peripheral portion thereof by the clamp members 52 via the frame 41, the expand tape 40 is caused to expand in the plane direction at a part thereof between the inner peripheral edge of the frame 41 and the outer peripheral edge of the central region 22 of the first wafer 10-1. Here, the roller members 55 arranged on upper ends of the push-up members 54 reduce friction with the expand tape 40, so that the expand tape 40 is caused to expand in its entirety in the plane direction.

In the cooled expansion step, as a result of the expansion of the expand tape 40, a pull force radially acts on the expand tape 40. When the radial pull force acts on the expand tape 40, the individual arcuate portions 25 of the outer peripheral annular portion 23 are split from the central region 22 while using the modified region 21 (see FIG. 9) which is formed between the central region 22 and the outer peripheral annular portion 23 of the first wafer 10-1, and the modified regions 24 which are radially formed in the outer peripheral annular portion 23 of the first wafer 10-1, as starting points of splitting as depicted in FIG. 10. Here, as the expand tape 40 has been hardened by the cooling, the external force required for the splitting between the central region 22 and the individual arcuate portions 25 of the outer peripheral annular portion 23 is efficiently transmitted.

(Heat Shrinking Step)

Figure 11:
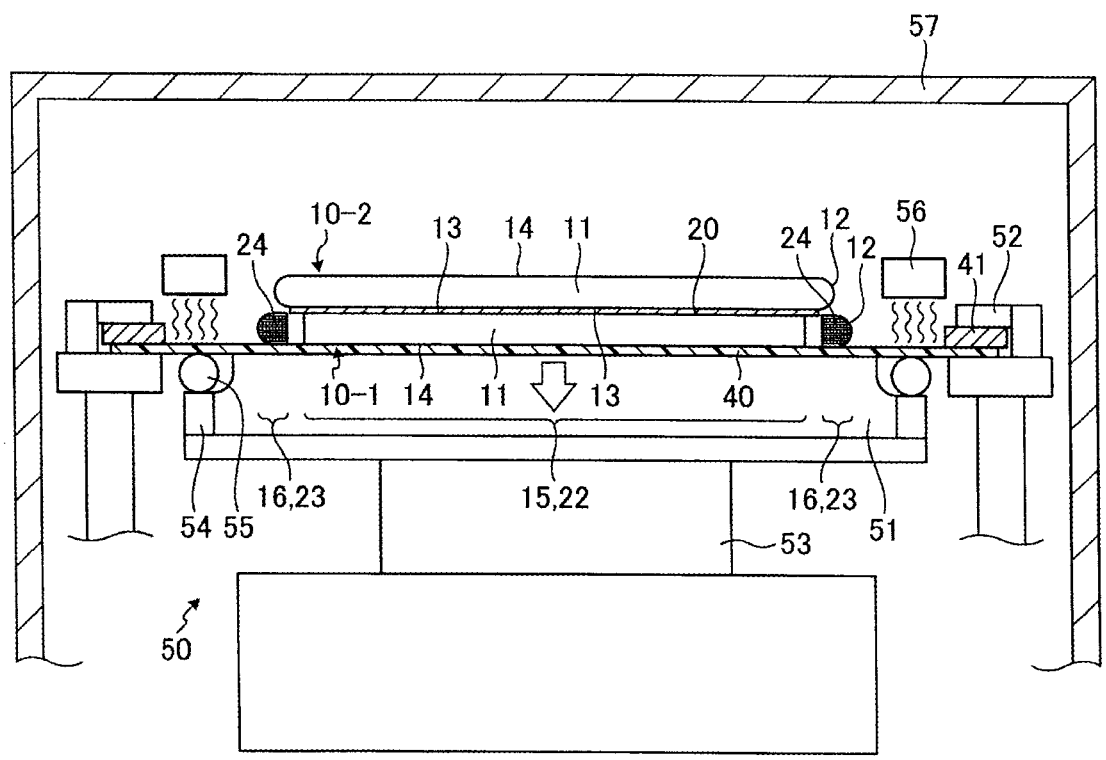
FIG. 11 is a cross-sectional view schematically depicting a state in a heat shrinking step in the outer peripheral annular portion break-off step depicted in FIG. 1.

FIG. 11 is a cross-sectional view schematically depicting a state in a heat shrinking step in the outer peripheral annular portion break-off step 4 depicted in FIG. 1. The heat shrinking step is performed after performing the cooled expansion step. In the heat shrinking step, a slack part of the expand tape 40, the slack part having been formed through the expansion of the expand tape 40, is heated to cause shrinkage of the slack part.

In the state that the expand tape 40 has been caused to expand in the plane direction after the cooled expansion step, the expand tape 40, at the part between the inner peripheral edge of the frame 41 and the outer peripheral edge of the central region 22 of the first wafer 10-1, extends linearly from a lower surface, in other words, the other surface of the frame 41 toward upper surfaces of the roller members 55 as seen in cross-section. In this state, the first wafer 10-1 is sucked on the side of the back surface 14 thereof by the chuck table 51 via the expand tape 40 in the heat shrinking step. As a consequence, the expand tape 40 is maintained in the state that the width between the central region 22 and the individual arcuate portions 25 of the outer peripheral annular portion 23 has been expanded.

In the heat shrinking step, the chuck table 51 and the push-up members 54 are next integrally lowered. Here, the expand tape 40 is fixed at an outer peripheral portion thereof by the clamp members 52 via the frame 41 and is sucked at a central portion thereof by the chuck table 51. Therefore, the inner peripheral edge of the frame 41 and the outer peripheral edge of the central region 22 of the first wafer 10-1 come closer to each other, the radial pull force acting on the expand tape 40 is reduced, and a slack is formed on the expand tape 40 at the part between the inner peripheral edge of the frame 41 and the outer peripheral edge of the central region 22 of the first wafer 10-1.

In the heat shrinking step in this embodiment, the chuck table 51 and the push-up members 54 are integrally lowered, and at the same time, the expansion device 50 is heated and shrunk at the slack part thereof by a heating unit 56. The heating temperature of the heating unit 56 is, for example, approximately 600° C.

A heat source element of the heating unit 56 heats the expand tape 40, for example, while moving along a peripheral direction of the part between the inner peripheral edge of the frame 41 and the outer peripheral edge 12 of the first wafer 10-1. As a consequence, the expand tape 40 is shrunk at the part thereof between the inner peripheral edge of the frame 41 and the outer peripheral edge 12 of the first wafer 10-1. It is to be noted that the heating unit 56 is described as being arranged within the chamber 57 in this embodiment, but the heat shrinking step may also be performed after the cooled expansion step by transferring the expand tape 40 along with the bonded wafer (the first wafer 10-1 and the second wafer 10-2), which is held on the frame 41 via the expand tape 40, to a separate processing unit having a heating unit.

When separating the bonded wafer from the expand tape 40 using an ultraviolet irradiation unit after performing the cooled expansion step and the heat shrinking step, use of a jig or the like is preferred to restrict an area to be irradiated such that ultraviolet (UV) light is not irradiated to the outer peripheral annular portion 23. Owing to the use of the jig or the like, the back surface 14 of the first wafer 10-1 is separated at only a part thereof, which corresponds to the central region 22, from the expand tape 40, and the outer peripheral annular portion 23 remains on the expand tape 40.

(Grinding Step 5)

Figure 12:
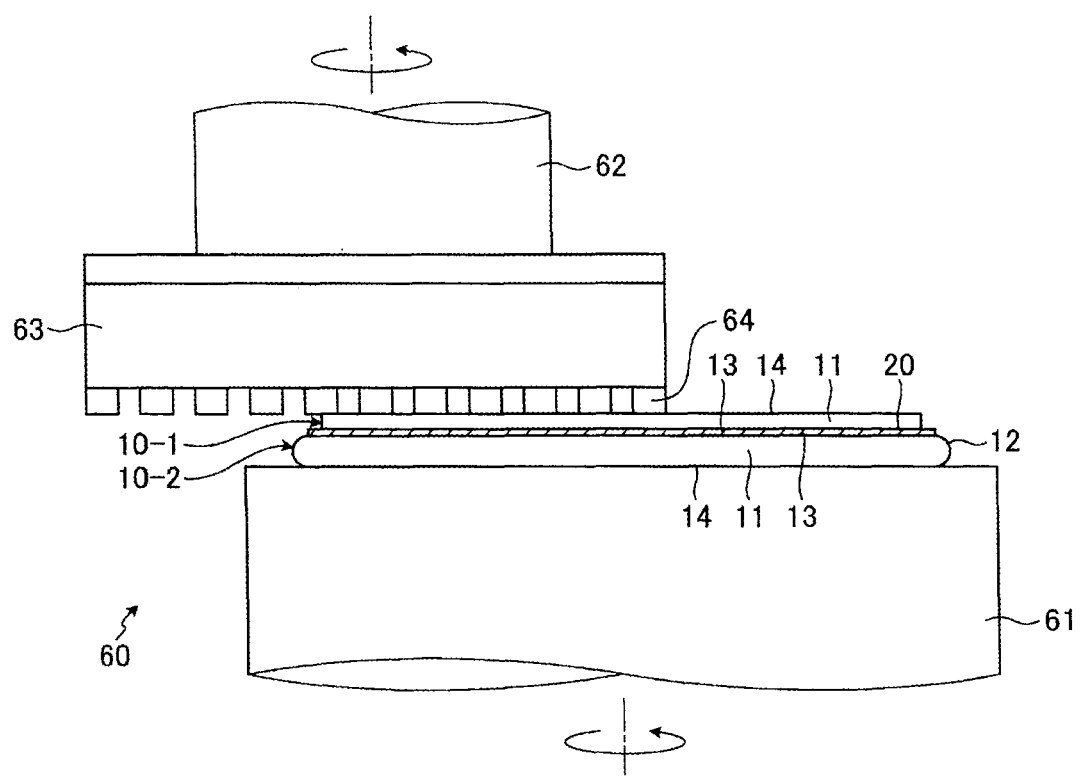
FIG. 12 is a cross-sectional view schematically depicting a state in a grinding step depicted in FIG. 1.

FIG. 12 is a cross-sectional view schematically depicting a state in a grinding step 5 depicted in FIG. 1. In the grinding step 5, the first wafer 10-1 is ground from the other surface and is thinned to a predetermined thickness. The grinding step 5 is performed after performing the outer peripheral annular portion break-off step 4. In the grinding step 5 in this embodiment, the first wafer 10-1 is ground from the back surface 14 thereof.

In the grinding step 5, the back surface 14 of the first wafer 10-1 held on a holding surface of a chuck table 61 is ground by a grinding apparatus 60. The grinding apparatus 60 includes the chuck table 61, a spindle 62 as a rotating shaft member, a grinding wheel 63 attached to a lower end of the spindle 62, and grinding stones 64 fitted on a lower surface of the grinding wheel 63. The grinding wheel 63 rotates about an axis of rotation that is parallel to a central axis of the chuck table 61.

In the grinding step 5, the second wafer 10-2 is first held on the side of the back surface 14 thereof under suction on the holding surface of the chuck table 61. With the chuck table 61 kept rotating about the central axis thereof, the grinding wheel 63 is then rotated about the axis of rotation. By supplying grinding water to a processing point, and at the same time, bringing the grinding stones 64 of the grinding wheel 63 closer to the chuck table 61 at a predetermined feed rate, the first wafer 10-1 is ground at the back surface 14 thereof by the grinding stones 64 and is thinned to the predetermined finish thickness.

As described above, the processing method of this embodiment for the wafer 10 forms the modified regions 21 and 24 as starting points of splitting by the laser beam 30 along the outer peripheral edge of the device region 15 after the formation of the bonded wafer and before the thinning through grinding, and removes the outer peripheral annular portion 23 which corresponds to the outer peripheral surplus region 16, by causing expansion of the expand tape 40 bonded to the wafer 10 (the first wafer 10-1) in which the modified regions 21 and 24 are formed.

Accordingly, the outer peripheral annular portion 23 does not break off during grinding, thereby eliminating the problem that the outer peripheral annular portion 23 may break off, may scratch or otherwise damage the grinding stones 64, and may deleteriously affect the processing results. During grinding, the part of the outer peripheral surplus region 16 does not break off and does not pile up in a processing chamber. The frequency of cleaning can hence be decreased significantly. The individual arcuate portions 25 of the outer peripheral annular portion 23 break off from the central region 22 while still adhering to the expand tape 40, and therefore does not break off unintentionally, thereby enabling to reduce the deleterious effect that arises upon break-off of the outer peripheral annular portion 23.

It is to be noted that the present invention is not limited to the embodiment described above. In other words, the present invention can be practiced with various modifications within the scope not departing from the spirit of the present invention. In the cooled expansion step, for example, the expand tape 40 is caused to expand by raising the chuck table 51 in this embodiment. However, the clamp members 52 may be lowered. In other words, it is necessary to raise the chuck table 51 relative to the clamp members 52 or to lower the clamp members 52 relative to the chuck table 51. As a still further alternative, the expand tape 40, with the push-up members 54 kept in contact with a side of an upper surface of the expand tape 40, may be caused to expand by lowering the chuck table 51 relative to the clamp members 52 and raising the clamp members 52 relative to the chuck table 51.

The present invention is not limited to the details of the above-described preferred embodiment. The scope of the invention is defined by the appended claims and all changes and modifications as fall within the equivalence of the scope of the claims are therefore to be embraced by the invention.

What is claimed is:

1. A wafer processing method comprising:
   a bonded wafer forming step of forming a bonded wafer by bonding one of surfaces of a first wafer that includes on the one surface thereof a device region with devices formed therein and an outer peripheral surplus region surrounding the device region and is chamfered at an outer peripheral edge thereof, to one of surfaces of a second wafer;
   a segmenting step of irradiating a laser beam of a wavelength that has transmissivity for the first wafer along a position on a side inner by a predetermined distance from the outer peripheral edge of the first wafer and forming an annular modified region, thereby segmenting the first wafer into an outer peripheral annular portion corresponding to the outer peripheral surplus region and a central region corresponding to the device region;

an expand tape bonding step of, before or after performing the segmenting step, bonding an expand tape that has expandability, to the other surface of the first wafer;

an outer peripheral annular portion break-off step performed after performing the bonded wafer forming step, the segmenting step, and the expand tape bonding step, the outer peripheral annular portion break-off step including:

cooling a chamber including an expansion device to a predetermined temperature;

loading the first wafer bonded to the expand tape into the cooled chamber and cooling the expand tape before expanding the expand tape; and expanding the expand tape, thereby splitting the first wafer into the outer peripheral annular portion and the central region from the annular modified region as a starting point and breaking off the outer peripheral annular portion from the bonded wafer; and a grinding step of, after performing the outer peripheral annular portion break-off step, grinding the first wafer of the bonded wafer from a side of the other surface thereof to a finish thickness.

2. The wafer processing method according to claim 1, wherein the segmenting step includes, after segmenting the first wafer into the outer peripheral annular portion and the central region, a supplemental segmenting step of irradiating the laser beam to the outer peripheral annular portion and forming modified regions in a like plurality of radial directions, thereby segmenting the outer peripheral annular portion into a plurality of arcuate portions.

3. The wafer processing method according to claim 1, wherein the outer peripheral annular portion break-off step further includes a heat shrinking step of heating a slack part of the expand tape, the slack part having been formed through expansion of the expand tape to shrink the slack part.

4. The wafer processing method according to claim 1, wherein expanding the expand tape includes moving rolling members into contact with the expand tape between an inner peripheral edge of a frame and an outer peripheral edge the first wafer.

* * * * *